United States Patent [19]

VanRenssen et al.

[11] 4,012,094

[45] Mar. 15, 1977

[54] ELECTRON TUBE SOCKET HAVING SPRING-WIRE CONTACTS

[75] Inventors: Marinus VanRenssen, Leola; Myron Henry Wardell, Jr., Lititz, both of Pa.

[73] Assignee: RCA Corporation, New York, N.Y.

[22] Filed: June 13, 1974

[21] Appl. No.: 479,138

[52] U.S. Cl. .......................... 339/17 D; 339/193 P; 339/193 S; 339/206 L

[51] Int. Cl.² .......................................... H05K 1/12

[58] Field of Search ....... 339/193 R, 193 N, 193 P, 339/193 S, 193 VS, 194 R, 194 N, 206 R, 206 P, 206 L, 210 R, 210 M, 210 T, 214 R, 214 C, 214 S, 17 D

[56] References Cited

UNITED STATES PATENTS

| | | | |
|---|---|---|---|
| 1,758,269 | 5/1930 | Wiegand | 339/193 R |
| 2,036,384 | 4/1936 | Alden | 339/193 R |
| 2,297,449 | 9/1942 | Baumbach | 339/193 R |
| 2,794,962 | 6/1957 | Donato | 339/194 R |
| 3,771,105 | 11/1973 | Yamazaki | 339/193 VS |
| 3,818,278 | 6/1974 | Adler | 339/193 R |

FOREIGN PATENTS OR APPLICATIONS

| | | | |
|---|---|---|---|
| 1,161,623 | 3/1958 | France | 339/194 |
| 263,415 | 12/1926 | United Kingdom | 339/193 R |

*Primary Examiner*—Roy Lake
*Assistant Examiner*—Mark S. Bicks
*Attorney, Agent, or Firm*—G. H. Bruestle; L. Greenspan

[57] ABSTRACT

An electron-tube socket comprising a plurality of spring wires in a circular array, each wire including (i) a base portion adapted to be clamped in a fixed position within the socket, (ii) an extended portion terminating in a free end which extends towards the open side of the socket cavity and including a contacting section adapted for contacting a pin of the electron tube and (iii) a transitional portion connecting the base portion with the extended portion and adapted to urge the contacting section against the pin.

1 Claim, 5 Drawing Figures

ELECTRON TUBE SOCKET HAVING SPRING-WIRE CONTACTS

BACKGROUND OF THE INVENTION

This invention relates to a novel socket which is particularly useful for connection to a cathode-ray tube during the high-voltage processing thereof.

In the manufacture of a cathode-ray tube, after the tube has been evacuated and sealed, it is the practice to subject the tube to high-voltage processing; as described, for example, in U.S. Pat. Nos. 3,698,786 to E. A. Gronka and 2,917,367 to T. E. Nash et al. The tube is supported on a conveyor holder, and the socket, which is attached to a cable, is plugged onto the tube base. The tube is then transported on the conveyer with the cable dangling below while the tube is processed. Subsequently, when the processing is complete, the socket is withdrawn from the tube base and the tube is unloaded.

The socket is used repeatedly for a progression of tubes and must be able to endure considerable wear in repeated pluggings and unpluggings. When a socket is to be replaced, the replacement should be quick and easy. The socket contacts must not score or otherwise degrade the tube base. Prior sockets have had a relatively short life and have required considerable labor for repair and replacement. Prior socket contacts have tended to bind on the base pins when the socket is unplugged, even though the required withdrawal force is only two pounds. In a type of base where each pin is backed up along its length in a groove molded in the plastic base, the socket contacts have tended to bind on the plastic that extends below the pins.

SUMMARY

The novel electron-tube socket has a cavity therein for receiving a tube base including a plurality of longitudinally-extending pins in a circular array about an axis. Within the cavity are a plurality of spring wires arranged in a circular array about the axis. Each spring wire includes (i) a base portion that is adapted to be clamped in a fixed position within the socket, (ii) an extended portion terminating in a free end which extends towards the open side of the cavity, and includes a section adapted for contacting one of said pins, and (iii) a transitional portion, preferably U-shaped, connecting the base portion with the extended portion and adapted to urge the contacting section against the pin. The novel socket includes also means for clamping the spring wires at the base portions thereof in said fixed positions, and longitudinally-extending recesses within the cavity adapted to maintain the extended portions of the spring wires in alignment.

Because of the spring-wire construction, particularly that the free end is towards the open side of the cavity, the socket contacts can endure more than twice as many, and as much as tenfold or more, tube insertions before one of the contacts fails due to fatigue or other causes as compared with contacts of prior sockets. The spring wires themselves are cheap and easy to make, and can be replaced within existing sockets with less labor than is required with prior sockets.

The contacting section of the spring wire does not tend to bind on the pin or base when the socket is unplugged, even when a force of about five pounds is required to withdraw the socket. This is believed to be because the pivot point for the spring wire is on the closed side of the cavity so that the spring wire rotates to an open, unbinding position when the socket is unplugged; and because the pivot point is closer to the axis so that the rotation occurs at a smaller angle with respect to the contact section. In prior sockets, the pivot point for the contact is placed on the open side of the cavity and further from the axis so that the contact section rotates to a closed, binding position at a relatively large angle when the socket is unplugged.

A further feature of the novel socket is that the extended portion of the spring wire may be preloaded or prestressed so that the contact can apply a greater pressure against the pin without requiring much travel. To this end, the socket is provided with means for limiting the travel of the free end of the extended portion when the socket is empty, and the transitional portion urges the free end against the limiting means sufficiently to preload the wire. By this expedient, a desired force within an operating range can be applied by the contacting section to the pin when the socket is filled. This provides for a more positive electrical contact to the pin and reduces the chance that the socket will become unplugged as it dangles from the conveyor during tube processing.

BRIEF DESCRIPTION OF THE EMBODIMENTS

Figure 1:
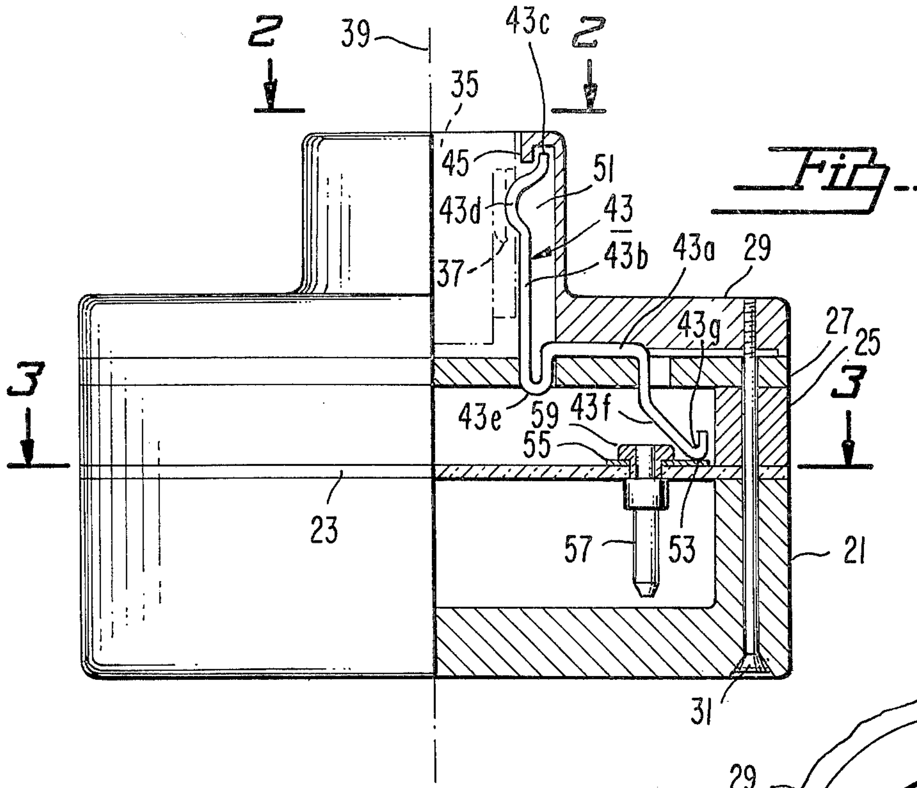
FIG. 1 is a partially-sectional, partially-elevational view of a novel socket of the invention.
Figure 2:
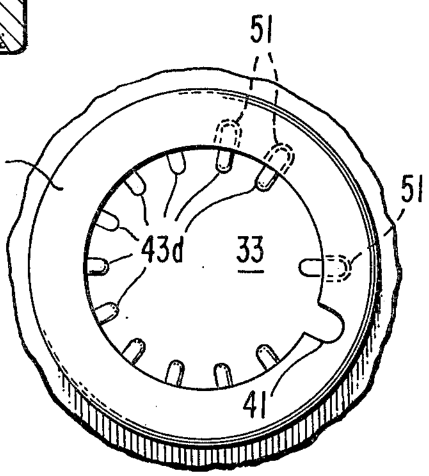
FIGS. 2 and 3 are plan and sectional views respectively of the socket of FIG. 1 viewed along lines 2—2 and 3—3 of FIG. 1.
Figure 3:
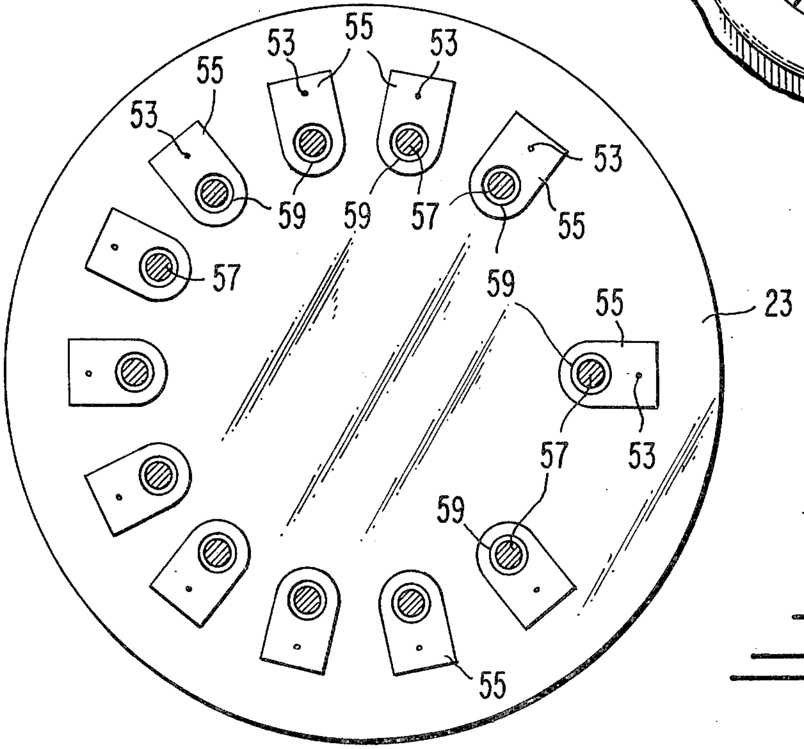

A preferred embodiment of the novel socket is illustrated in FIGS. 1, 2 and 3. The socket is cylindrical, about 3 1/16 inches in diameter, and is comprised of a cylindrical lower cap 21, a disc-shaped circuit board 23, a cylindrical spacer 25, a disc-shaped spring-wire holder 27 and an upper cap 29, all held together in that order by three screws 31. The upper cap 29 has molded therein a cavity 33 (FIG. 2) which is adapted in size and shape to receive a cylindrical tube base 35 (a portion thereof being shown in phantom) comprised of a plurality of pins 37 arranged in a circle about an axis 39. In this embodiment, the tube base has 12 pins set in 14 equally-spaced positions, one pin (at position 9) having an empty space (positions 8 and 10) on each side of it, as shown in FIG. 2. The cavity also has a keyway 41 recessed therein to receive a key that is molded in the tube base (at position 10).

Figure 4:
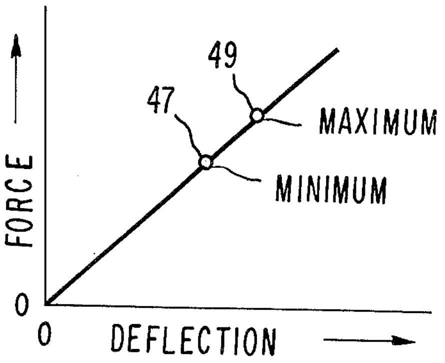
FIG. 4 is a force-versus-deflection diagram illustrating the prestressed feature of the spring wire in the socket of FIG. 1.

For each pin in the tube base, there is a spring wire 43 shaped from 40-mil-diameter beryllium-copper alloy wire stock. Each spring wire 43 has a base portion **43*a* adapted to be clamped in a fixed position within the socket. In this embodiment, there are 12 spring wires, each of substantially equal size and shape, each spring wire 43 including a base portion 43*a*, clamped between the upper cap 29 and the spring-wire holder 27. The spring wire 43 includes also an extended portion 43*b* terminating in a free end 43*c* which extends towards the open side of the socket; that is, the side into which the tube base is inserted (the top side as shown in FIG. 1). 43*b*** includes also a contacting section 43*d* which is curved inwardly towards the axis 39 to better adapt the spring wire 43 for contacting the pin 37. The spring wire 43 includes also a transitional portion 43*e* connecting the base portion 43*a* with the extended portion 43*b* and adapted to urge the contacting section 43*d* against the pin 37. As shown, the transitional section 43*e* is U-shaped which places most of the spring stress in that portion of the spring wire. The transitional portion 43*e* may be of other shapes, for example, L-shaped or S-shaped. The socket includes a stop 45 molded into upper cap 29 and adapted to limit the travel of the upper end 43*c* towards the axis 39 when the cavity is empty. In this way, the contacting section is always loaded as shown in FIG. 4. By loaded is meant that, when a tube base 35 is inserted in the cavity 33, the initial force at the stop 45 is some predetermined minimum value 47 which is much above zero. The force of the contacting section on the pin 37 reaches a maximum value 49 when it is fully deflected by the pin. Thus, only a small additional deflection is required to reach the desired maximum force value 49. The upper cap 29 includes also longitudinally-extending recesses 51 within the cavity which are adapted to maintain each of the extended portions 43*b* of the spring wires 43 in alignment.

In the embodiment of FIG. 1, the spring wire 43 includes also an auxiliary portion 43*f* connected to the clamping portion 43*a*. The auxiliary section 43*f* has a free end 43*g* extending away from the open side of the cavity, and somewhat outwardly from the axis 39 into spring contact with specific electrically-conducting points 53 on the circuit board 23 as shown in FIG. 3. The layout of conducting metal areas 55 of the circuit board is shown in FIG. 3; the metal areas are of copper metal about 0.0015 inch thick supported on a disc of glass-epoxy sheet about 1/16-inch thick and about 3 1/16 inch diameter. Other types of printed circuit boards may be used. A binding post 57 extends through the circuit board 23 at a position inward of each of the electrically-conducting points 53. A fillet of solder 59 attaches one end of the post 57 to the adjacent metal area 55. The extended portion of the posts 57 provides connection means for the wires of a power cable (not shown).

Figure 5:
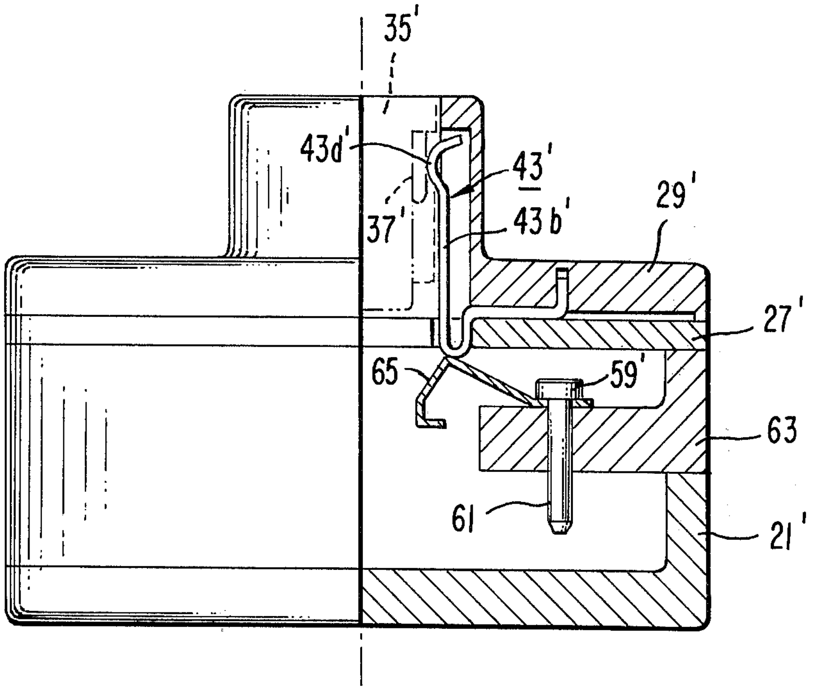
FIG. 5 is a partially-sectional, partially-elevational view of another embodiment of the invention.

FIG. 5 shows still another embodiment which is similar to the preferred embodiment shown in FIG. 1 except that the circuit board 23 and the auxiliary section 43*f* of the spring wire are omitted. Instead, a binding post 61 is supported in the cylindrical spacer 63 of the socket, and a spring contact 65 extends from the post 61 into contact with the transitional section of the spring wire 43'. Also, the structure does not include a stop or other means for limiting the travel of the end of the extended portion 43*b*'.

The novel socket has one or more of the advantages over prior sockets of lower initial cost, lower costs for repair and/or replacement, no chance of damage to the tube base, and easier and/or more reliable contact to the pins. This results from one or more of (1) the unitary spring-wire construction, (2) the placement of the pivot point and spring stress points on the closed side of the socket cavity and closer to the axis of the device, and (3) the preloaded feature to the spring wire. The spring wire may be of any cross-sectional shape. However, a round cross-section is preferred since it provides the least chance of arcing when a high voltage is applied and the least chance of scoring the tube base when the socket is withdrawn. The pivot point in the transition region should be placed relatively close to the axis and may even be closer to the axis than the pin on the tube base. In the preferred arrangement, the pivot point is so located that, the length of the extended portion and the axis are substantially parallel, so that the angle therebetween is very small thereby reducing the chance of the contacting section binding on the contacted pin when the socket is plugged on the base.

The novel sockets may be used wherever cathode-ray tubes are to be processed or tested and require the same socket to be plugged and unplugged on a progression of tubes. In a cathode-ray-tube-making factory, this would include the electrical-aging processors, the test sets, and the attached-yoke assembly machines. Because of the novel structure, the novel socket is particularly adapted to be plugged on small tube bases where there is little room for making contact to the pins. With the pivot point on the closed side of the cavity, the pivot point can be closer to the axis, and adequate contact area and adequate pressure can be applied to pins that are closely spaced to one another and to the exhaust tubulation of the tube.

We claim:

1. An electron-tube socket comprising

A. a cap having a cavity therein for receiving a tube base including a plurality of pins in a circular array about an axis, B. a wire holder adjacent said cap, C. a plurality of spring wires having a round cross-section arranged in a circular array about said axis, each spring wire including i. a single base portion clamped in a fixed position between said cap and said wire holder, ii. an extended portion terminating in a free end which extends towards the open side of said cavity and including a contacting section adapted for contacting one of said pins, iii. and a transitional portion connecting said base portion with said extended portion and adapted to urge said contacting section against said pin, D. means for clamping said cap and said holder together, and E. means within said cap for limiting the travel of said free end of each wire, said cap having longitudinally-extending recesses in the walls of said cavity adapted to maintain the extended portions of said wires in alignment, said socket containing a circuit board therein and at least some of said spring wires include also an auxiliary portion connected to said base portion and having a free end extending away from said open side of said cavity, said auxiliary portion being adapted to make spring contact to said circuit board contained in said socket.

* * * * *